United States Patent
Ha et al.

(10) Patent No.: US 6,836,110 B1
(45) Date of Patent: Dec. 28, 2004

(54) UNIVERSAL TESTER TO HANDLER DOCKING PLATE

(75) Inventors: Chee Kheong Ha, Melaka (MY); Yin Hock Tey, Melaka (MY); Bee Seng Lee, Melaka (MY)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/426,210

(22) Filed: Apr. 29, 2003

(51) Int. Cl.[7] .............................................. G01R 31/26
(52) U.S. Cl. ................................. 324/158.1; 324/765
(58) Field of Search ................................. 324/73.1, 754, 324/755–758, 765, 158.1; 414/416–417; 209/573; 73/866.5, 865.8

(56) References Cited

U.S. PATENT DOCUMENTS

| | | | |
|---|---|---|---|
| 5,489,852 A | 2/1996 | Gomez | 324/754 |
| 5,828,223 A * | 10/1998 | Rabkin et al. | 324/754 |
| 5,945,837 A | 8/1999 | Fredrickson | 324/761 |
| 5,982,182 A * | 11/1999 | Chiu et al. | 324/754 |
| 6,118,286 A | 9/2000 | Fredrickson | 324/754 |
| 6,204,679 B1 * | 3/2001 | Gray, III | 324/760 |
| 6,507,203 B1 * | 1/2003 | Hirschmann | 324/754 |

* cited by examiner

*Primary Examiner*—Minh N. Tang
(74) *Attorney, Agent, or Firm*—Beyer Weaver & Thomas, LLP

(57) ABSTRACT

An apparatus and method for docking testers to handlers during an integrated circuit electrical testing process is disclosed. A universal docking plate is provided to connect one or more of a plurality of different testers to a handler, and/or vice-versa, such that multiple docking plates for every different tester-handler combination are not required. This is accomplished by having different groupings of mounting holes on the universal docking plate, with each grouping corresponding to a separate tester. In addition to differing groupings of mounting holes being located on the same universal mounting plate, one or more adaptors may be provided with each grouping of mounting holes to facilitate the mounting of any particular tester to the mounting plate, and ultimately the handler.

25 Claims, 12 Drawing Sheets

UNIVERSAL TESTER TO HANDLER DOCKING PLATE

TECHNICAL FIELD

The present invention relates generally to an apparatus and method for integrated circuit ("IC") electrical testing, and more specifically to an apparatus and method for docking testers to handlers during an IC electrical testing process.

BACKGROUND

Semiconductor wafer fabrication involves complex manufacturing processes to produce integrated circuits on the surface of silicon wafers, and ultimately chips and other semiconductor devices. To ensure the quality of the integrated circuits produced on these wafers and chips, various testing methods have been devised to find defects, abnormalities and other items on the wafer, chip or other semiconductor device. Several such methods involve the placement of testing circuitry at various locations on the unit to be tested and the use of test signals to determine the functionality of the circuitry. Before individual devices or chips are approved and passed on, for example, they are subjected to final testing, one by one, by a suitable automatic apparatus. This test typically comprises various programmed electrical measurements that are intended to ascertain whether each device or chip conforms to certain desired functional requirements.

The generic use of device "testers" and "handlers" is well known in the semiconductor industry as tools for the electrical testing of IC components during the manufacture of semiconductor wafers, devices and chips. An IC device tester is typically an expensive piece of computing equipment that transmits test signals via tester probes to an IC device and also processes signals received from the IC device. An IC device handler is typically an expensive robot adapted to move IC devices from one location to a test location where the tester probes are located, and then back to the original location or, alternatively, some other location. Apparatuses and methods for utilizing such handlers and testers are well known, and instances of such apparatuses and methods can be found, for example, in U.S. Pat. Nos. 5,489,852; 5,945,837; and 6,118,286, for example, all of which are incorporated herein by reference in their entirety.

Device testers and device handlers are typically purchased by end IC device manufacturers from different companies. The choice of a particular device tester depends upon a number of factors, such as, for example, the number of pins associated with the IC manufacturer's IC devices. That is, the device tester must have a number of tester probes that is equal to or greater than the number of pins utilized by the most complex IC device to be tested by that tester. For example, depending upon the devices to be tested, it may be desirable to have a tester capable of testing a maximum of 50 leads, 100 leads, or even 200 leads, among others. In addition, there are various test capabilities that may or may not be present on a given tester. These include the ability to conduct digital IC tests, analog IC tests, mixed signal IC tests and high frequency IC tests, among others. Due to these differing needs among IC device manufacturers, most IC device tester manufacturers thus make a plurality of different tester types or models.

Device handlers are selected based on a number of factors as well, such as, for example, the required throughput (i.e., the rate at which IC devices are to be tested) and the specific function or functions to be performed. Specific functions include the ability to process IC devices with, for example, a TSSOP package having 14 to 28 leads, a TSSOP package having 32 to 56 leads, a SOIC package having 14 to 44 leads, a QFP package having 200 leads, and a MSOP package having 8 leads, among others. Although many handlers may be configured to be compatible with a variety of package specifications, typically only one configuration is possible at a time, with significant effort and down time being required to reconfigure the handler to a different configuration. Additionally, many IC devices require more than one type of test during the testing processing, which in turn requires more than one type of tester and/or handler. For at least the foregoing reasons, a plurality of different types of handlers are typically used by many IC device manufacturers, with most IC device handler manufacturers thus typically making a plurality of different handler types or models.

Testers are made by manufacturers such as, for example, Teradyne, Inc. of Boston Mass. and Eagle Test Systems of Mundelein, Ill., among others. In addition to there being many different manufacturers of IC device testers, each manufacturer will typically make several different kinds or models of testers. Such makes and models include, for example, the Teradyne J750, Teradyne Catalyst, Teradyne A567, Teradyne A575, Teradyne A530, Teradyne A535, Eagle E500, Eagle E364, and Eagle E200, among others. Handlers are made by manufacturers such as, for example, Multitest GmbH of Rosenheim, Germany; Yokogawa Electric Corporation of Tokyo, Japan; Delta Design of San Diego, Calif.; and Shinano Electronics Company Ltd. (Synax) of Matsumoto, Japan, among others. As in the case of testers, each handler manufacturer will typically make several different kinds or models of handlers. Such makes and models include, for example, the Multitest MT9918, Multitest MT9308, Yogokawa 9730, Delta 1688, Delta Turbo, and Synax SX1701, among others. Although the foregoing have been provided as listed examples, it is understood that many other manufacturers, makes and models of testers and handlers also exist, and that such entities and devices may increase or change in the future.

For typical IC testing to take place, a particular handler needs to be coupled or docked with a particular tester, such that a specific test site on the handler mates with a specific location on the tester. Thus, in addition to a device tester and a device handler, most conventional IC device testing systems typically include some form of interface structure as well. This interface structure may be connected to the tester probes, and typically includes a test area (i.e., socket arrangement) for receiving IC devices from the device handler. In addition, most conventional interface structures comprise a customized docking plate that is specially adapted for a particular make and model of IC device tester and a particular make and model of IC device handler. Customization is required due to the differing mounting requirements for each different tester and likewise for each different handler, as there exists no industry-wide standardization in this regard. Such docking plates can be made by the tester manufacturer or handler manufacturer, but are often custom made by the end IC device manufacturer to interface between a particular make and model of IC device tester and a particular make and model of IC device handler.

Turning now to FIG. 1, an exemplary handler used for the electrical testing of an integrated circuit during a commercial chip manufacturing process is illustrated in perspective view. Handler 10 (which is a Multitest MT9308, although the particular make and model is not important for these generic illustrative purposes) comprises an input loader 11, a test site 12, and output tubes 13. In general, an IC device to be tested (not shown) is loaded into a tube (not shown), which is then placed at the input loader 11 of the handler 10. The handler then transfers this IC device in automated fashion to the test site 12, which comprises a window within the handler, and arranges the IC device into a position on a test socket to be tested by an IC device tester (not shown). The handler then issues a start signal to the tester, whereupon the tester tests the IC device, and the tester then sends an "accept" or "reject" signal to the handler. The handler then sorts the IC device according to this signal from the tester, and the IC device is sent to the appropriate "accept" or "reject" tube among output tubes 13.

Referring to FIGS. 2 and 3, the exemplary handler of FIG. 1 and an accompanying tester used for the electrical testing of an integrated circuit during a commercial chip manufacturing process are illustrated in side perspective views. In FIG. 2, handler 10 is shown in close proximity to, but undocked with tester 20 (which is a Teradyne Catalyst in FIG. 2, although the particular make and model is not important for these generic illustrative purposes). Mounted to handler 10 about the test site 12 is a conventional docking plate 30, which is particularly adapted for this particular handler and this particular tester (i.e. a Multitest MT9308 and a Teradyne Catalyst in this particular illustration). Tester 20 typically comprises a test head 21 having multiple electrical leads or probes, a support frame or structure 22 and one or more electrical connections 23 from the test head to one or more control units. In FIG. 3, tester 20 is shown as docked to handler 10 via conventional mounting plate 30, such that standard electrical testing can take place.

Turning now to FIG. 4, an exemplary conventional docking plate used for docking a tester to a handler during the electrical testing of an integrated circuit during a commercial chip manufacturing process is illustrated in front perspective view. Continuing somewhat with the foregoing illustrative example, conventional docking plate 30 is specifically configured to couple or dock a Multitest MT9308 handler to an Eagle ETS500 tester. Accordingly, docking plate 30 comprises various holes 31 and slots 32 of specific sizes and locations, in order to facilitate such a docking. While some of these holes and/or slots are required as a result of the specific handler being docked (i.e., a Multitest MT9308, or other similar Multitest 93xx model type), others are required as a result of the specific tester being docked (i.e., an Eagle ETS500). In the end, the sum of the particular size and shape of the docking plate, as well as the size and location of all the various holes and slots in the docking plate, is a direct result of the customization of the docking plate to dock a particular tester to a particular handler.

Although the foregoing generic illustrative example relates to one specific tester, one specific handler, and one specific conventional docking plate, this example will be readily understood by one skilled in the art to be applicable to many other makes and models of testers and handlers, with one or more variations, depending on the particular makes and models used. Because more than one type of tester and/or more than one type of handler are typically required for conventional testing operations, and because a typical IC device manufacturer tends to make many different kinds of IC devices, however, many different conventional docking plates are needed during all testing processes performed by a particular IC device manufacturer. Each different conventional docking plate typically has a unique shape and set of mounting holes, whereby this shape and these mounting holes are specifically designed to couple one particular type of handler to one particular type of tester.

Thus, for the case of five different handlers and five different testers, twenty-five separate conventional docking plates are needed in order for each handler to be able to couple or dock to each different tester.

Not only does this need for multiple docking plates result in a significant increase in hardware costs, it also results in significant additional expenditures of the time that is required to perform all desired electrical test functions for all manufactured IC devices. This undesirable increase in the time required to use a different docking plate to set up each electrical test results in an increase in labor costs and a decrease in manufacturing efficiencies.

Accordingly, there exists a need for an apparatus and method for docking testers to handlers during an IC electrical testing process that involves fewer docking plate changeovers, and in particular for such an apparatus and method to result in fewer docking plates needed to complete all desired electrical tests on any and all IC devices being manufactured.

SUMMARY

It is an advantage of the present invention to provide an apparatus and method for for docking testers to handlers during an IC electrical testing process. According to one embodiment of the present invention, the provided apparatus and method involve the elimination of the typical need for multiple docking plates corresponding to each different handler to tester combination. This is accomplished by providing a universal docking plate capable of mounting more than one tester to each handler, more than one handler to each tester, or both. This universal docking plate contains a plurality of mounting hole groupings, with each mounting hole grouping corresponding to a different tester and/or different handler. In addition, one or more adaptors may be necessary to facilitate the connection at each docking hole grouping and tester interface.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive universal tester to handler docking plate. These drawings in no way limit any changes in form and detail that may be made to the invention by one skilled in the art without departing from the spirit and scope of the invention.

DETAILED DESCRIPTION

An example application of an apparatus and method according to the present invention is described in this section. This example is being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following example should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

One advantage of the present invention is the elimination or reduction of the need for multiple docking plates according to the various combinations of testers and handlers that may be required in one or multiple series of IC electrical testing processes. Such an elimination or reduction results in a net savings to the manufacturer, at least in its costs of manufacturing equipment.

Another advantage of the present invention is the inherent increase in manufacturing efficiency resulting from this reduction or elimination of multiple docking plates, as the added time and effort required for docking plate changes is also reduced or eliminated. Also eliminated is the need for separate engineering drawings and techniques for manufacturing a wide variety of different conventional docking plates, as well as the need for separate designations, inventory lists, storage areas, and the like that are inherent to similar but distinct equipment or parts.

Newer technologies and innovations have advanced the field of IC device manufacturing rapidly in the past few decades, offering new opportunities for manufacturers to produce products such as IC devices and chips more rapidly and efficiently. The present invention adds to the advancement of this field by providing a new apparatus and method for docking testers to handlers during an IC electrical testing process without the need for multiple docking plates and the added time and expenses involved with such multiple docking plates.

Figure 5:
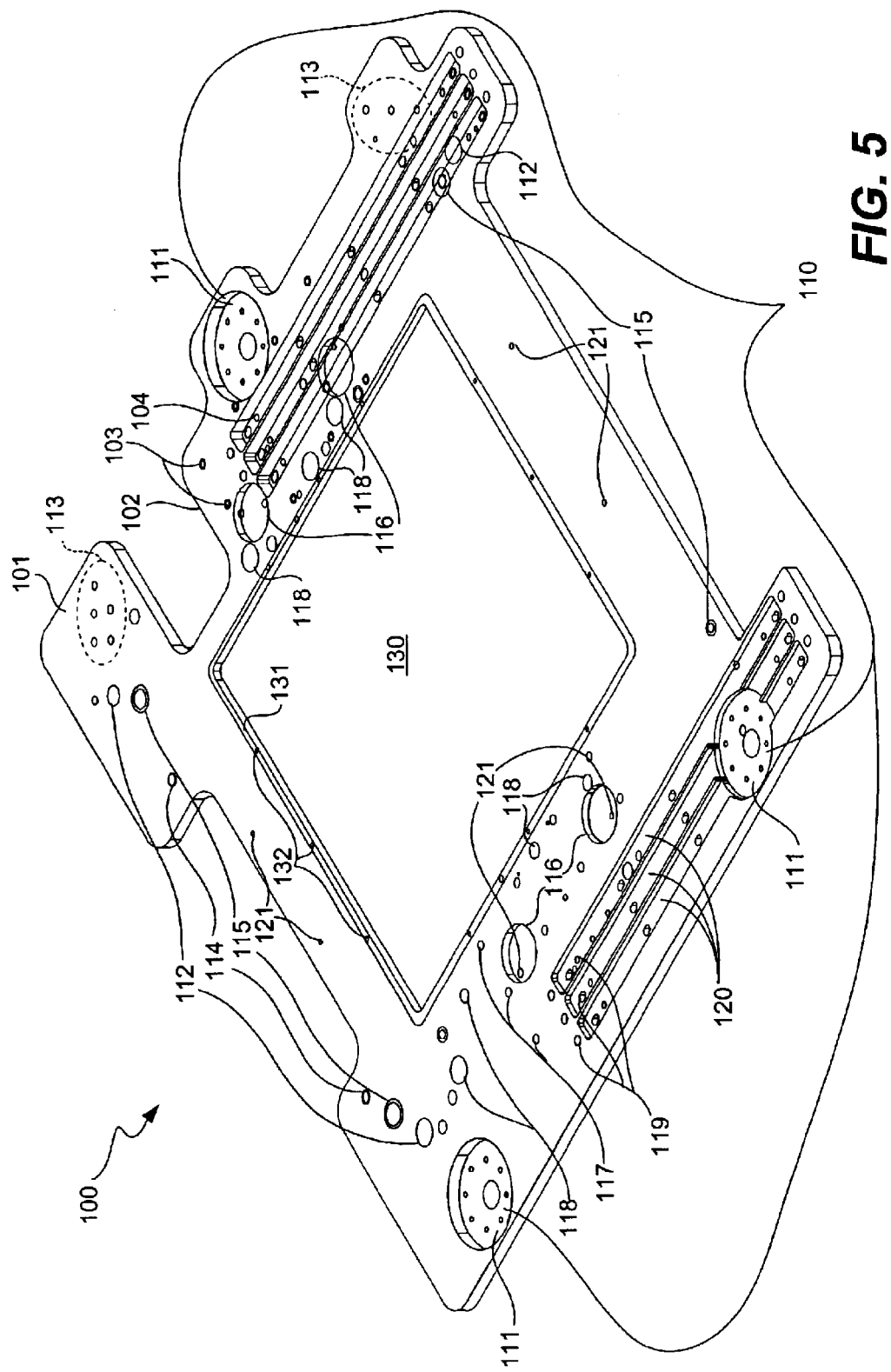
FIG. 5 illustrates in front perspective view an exemplary universal docking plate according to one embodiment of the present invention.

Turning now to FIG. 5, an exemplary universal docking plate according to one embodiment of the present invention is illustrated in front perspective view. Universal docking plate 100 comprises numerous shapes 101, contours 102, holes 103, grooves 104, indentations and the like, all configured in such a manner so as to be capable of coupling one or more different types of handlers to one or more different types of testers. Thus, while a conventional docking plate is only capable of coupling one type of tester to one type of handler, such that the sum of all types of handlers and all types of testers that can be coupled by the conventional docking plate is only two, the universal docking plate of the present invention is capable of coupling more than one type of tester and/or more than one type of handler, such that the sum of all types of handlers and all types of testers that can be coupled by the inventive universal docking plate is at least three. In this sense, the term "universal" as used herein does not mean that the inventive docking plate can couple all types of testers to all types of handlers. Rather, the term "universal" as used herein simply designates that the inventive docking plate can couple more types of testers and/or more types of handlers than a conventional docking plate.

Similarly, as used throughout this description and in the appended claims, the term "type of tester" is refers only to all IC electrical testing testers having substantially the same mounting or coupling requirements, such that the same conventional docking plate may be used to dock such testers with a given IC electrical testing handler. Differing test features, capabilities, costs, and all other parameters are irrelevant for purposes of the term "type of tester" as used herein. For example, while a Teradyne A530 and a Teradyne A535 are technically two different models of testers, they are both similar enough such that both can be mounted to a given handler with the same conventional docking plate. In this sense then, these two testers, as well as any other similarly related tester model, are the same "type of tester" for the purposes contained herein. Likewise, as used throughout this description and in the appended claims, the term "type of handler" refers only to all IC electrical testing handlers having substantially the same mounting or coupling requirements, such that the same conventional docking plate may be used to dock such handlers with a given IC electrical testing tester. As a further illustrative example, while a Multitest MT9308 and a Multitest MT9918 are technically two different models of handlers, they are both similar enough such that both can be mounted to a given tester with the same conventional docking plate. Similarly, these two handlers, as well as any other Multitest MT9000 series or other similarly related handler model, are the same "type of handler" for the purposes contained herein.

Universal docking plate 100 has been configured to couple one or more types of integrated circuit electrical testing testers to one or more types of integrated circuit electrical testing handlers, such that the sum of all possible types of testers and all possible types of handlers that can be coupled by said docking plate is at least three. In fact, the sum of all possible types of testers and all possible types of handlers that can be coupled by this particular universal docking plate is actually eleven, which is the result of this docking plate being compatible with at least seven different types of testers and at least four different types of handlers. In particular, the different types of testers that can be coupled by universal docking plate 100 include: 1) the Teradyne J750 and other testers of the same type; 2) the Teradyne Catalyst and other testers of the same type; 3) the Teradyne A567, Teradyne A575 and other testers of the same type; 4) the Teradyne A530, Teradyne A535 and other testers of the same type; 5) the Eagle E500 and other testers of the same type; 6) the Eagle E364 and other testers of the same type; and 7) the Eagle E200 and other testers of the same type. Similarly, the different types of handlers that can be coupled by universal docking plate 100 include: 1) the Multitest MT9918, Multitest MT9308 and other handlers of the same type; 2) the Yogokawa 9730 and other handlers of the same type; 3) the Delta 1688, Delta Turbo and other handlers of the same type; and 4) the Synax SX1701 and other handlers of the same type. Although the universal docking plate 100 illustrated and described herein has been limited to the specific testers and handlers listed above for practical reasons and purposes of illustration, it will be readily understood by one skilled in the art that other tester types and/or handler types may be added and/or substituted for one of more of the specific types listed here, and such other additions and/or substitutions are specifically contemplated by the present invention.

As a result of its compatibility with so many different types of testers and so many different types of handlers, use of the particular inventive universal docking plate described herein results in the elimination of the typical need for 25 different conventional docking plates corresponding to each different combination of one of the five listed types of testers to one of the five listed types of handlers. This is generally accomplished through incorporating the varying coupling and mounting requirements of different types of testers and handlers onto the relatively complex inventive universal docking plate. Universal docking plate 100 contains a plurality of mounting hole groupings 110, wherein each mounting hole grouping corresponds to a different tester and/or a different handler. Although the term "mounting hole grouping" has been used herein, it will be readily understood that such a grouping includes not only holes, but also any shapes, contours, grooves, indentations and other features that are required for the mounting of a specific tester or handler. While any particular conventional docking plate will thus have only two such mounting hole groupings, one for its particular tester and one for its particular handler, the inventive universal docking plate will have at least three such mounting hole groupings. In fact, the number of mounting hole groupings in exemplary universal docking plate 100 is actually on the order of eleven, as detailed herein.

In this specific embodiment illustrated as universal docking plate 100, the exemplary mounting hole grouping actually designated as 110, individual elements of which are designated separately as individual mounting indentations and holes 111, comprises the mounting indentations and holes that are required for a Teradyne J750 and other testers of the same type. Another mounting hole grouping (each further mounting hole grouping not also being designated as 110 for purposes of clarity) comprises a grouping of individual mounting holes 112 and 113 that are required for an Eagle ETS364 and other testers of the same type. In particular, mounting holes 112 represent those required for ETS364 dowel pins, while separate patterns of individual mounting holes 113 are those that are required for adding ETS364 gussets, as would be readily understood by those skilled in the art. In terms of the Eagle ETS364 then, the combination of all mounting holes 112 and all separate patterns of individual mounting holes 113 comprises a single "mounting hole grouping." Next, another mounting hole grouping comprises individual mounting holes 114, which are those that are required for the dowel pins of a Teradyne Catalyst and other testers of the same type. Furthermore, individual mounting holes 115 are those that are required for the dowel pins of a Teradyne A567, Teradyne A575 and other testers of the same type. Lastly, in terms of testers, individual circular indentations 116 are those that are required for the mounting of an Eagle E500 and other testers of the same type.

Similarly, universal docking plate 100 comprises several mounting hole groupings corresponding to the different types of handlers that can be coupled or "mounted" by this universal docking plate. In particular, individual mounting holes 117 comprise those that are required for coupling with a Multitest MT9918, Multitest MT9308 and other handlers of the same type. Likewise, individual mounting holes 118 comprise those that are required for mounting with a Yogokawa 9730 and other handlers of the same type. In addition, individual docking holes 119 and individual longitudinal grooves 120 comprise those features that are required for mounting, docking or coupling with a Delta 1688, a Delta Turbo and other handlers of the same type. Finally, for purposes of the exemplary list of types of handlers accounted for by the illustration described herein, individual mounting holes 121 comprise those that are required for mounting with a Synax SX1701 and other handlers of the same type.

While the many variations in the various holes, grooves, indentations and the like that are required for mounting various testers or handlers can be handled by including any of such features located generally around a perimeter of a universal docking plate, as detailed above, the proliferation of such varying features, as well as variances in the details of the test site and test site components typically render such all-encompassing inclusions impractical towards the center of a universal docking plate. For example, while a test site opening may be only several inches wide for some handlers, the corresponding dimension in other handlers may be up to and in excess of one foot or more, and it may not be practical to have a large test site opening in the docking plate for handlers with smaller test sites. According to a particularly preferred embodiment of the present invention, such substantial variances within and near the test sites in different types of handlers and testers are compensated for by utilizing one or more readily attachable and removable adaptors in conjunction with the universal docking plate, with such adaptors being specifically adapted for particular handlers and/or testers.

Referring again to FIG. 5, universal docking plate 100 comprises a centrally removed portion or opening 130 about what will become the test site area. This central opening 130 is generally large enough such that all adaptors that are to be used in conjunction with universal docking plate 100 can be made to fit within opening 130 and secured to the universal docking plate. To this end, a recessed shelf 131 ringing the opening and securing holes 132 are utilized as standardized means for fastening or mounting each adaptor to the universal docking plate, although other similar mounting means will be readily understood by those skilled in the art. That is, while each conventional docking plate will have differing mounting requirements and procedures, the process for mounting most particularized adaptors to the universal docking plate will remain substantially similar. Although the use of such interchangeable adaptors may in some instances result in generally undesirable additional parts and/or switch over time when changing testers or handlers, the effect of such additional parts and/or time is significantly minimized over what is typically experienced in the cases of fully customized conventional docking plates, at least due to substantial reductions in the size and complexity of these adaptor, as well as in the substantially similar mounting requirements for each adaptor with respect to the universal docking plate.

Figure 1:
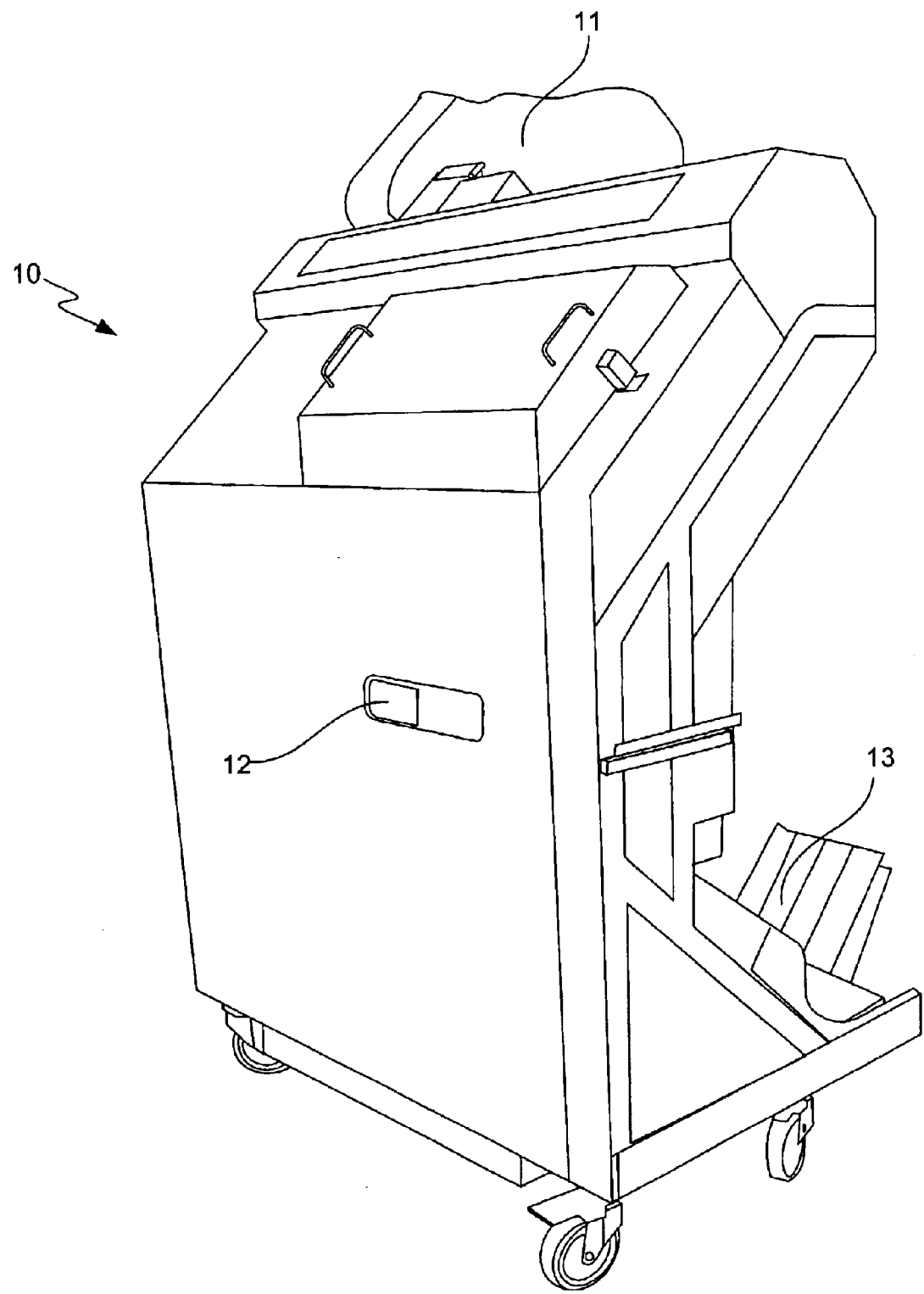
FIG. 1 illustrates in perspective view an exemplary handler used for the electrical testing of an integrated circuit during a commercial chip manufacturing process.
Figure 2:
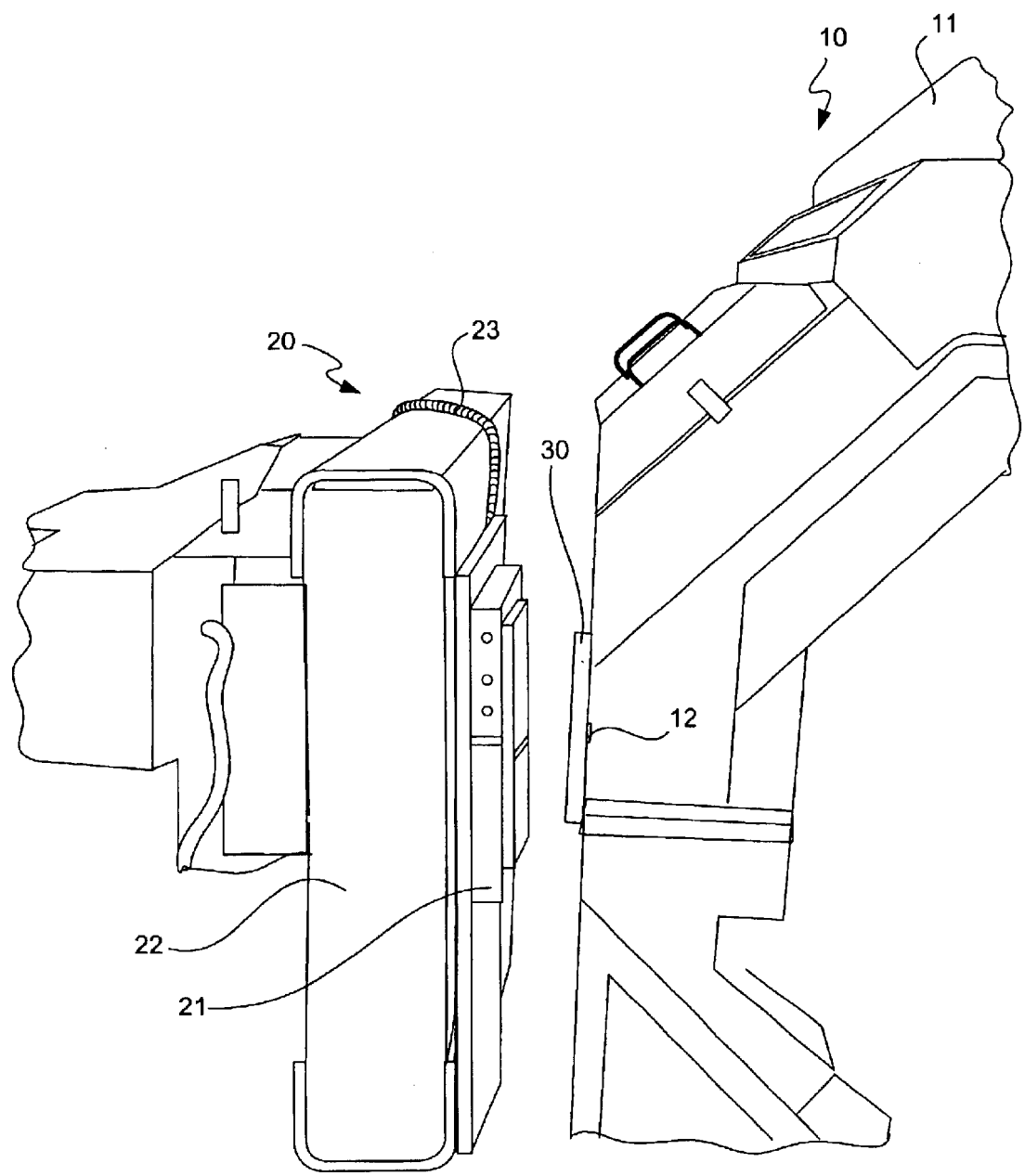
FIG. 2 illustrates in side perspective view the exemplary handler of FIG. 1 and an accompanying tester used for the electrical testing of an integrated circuit during a commercial chip manufacturing process.
Figure 3:
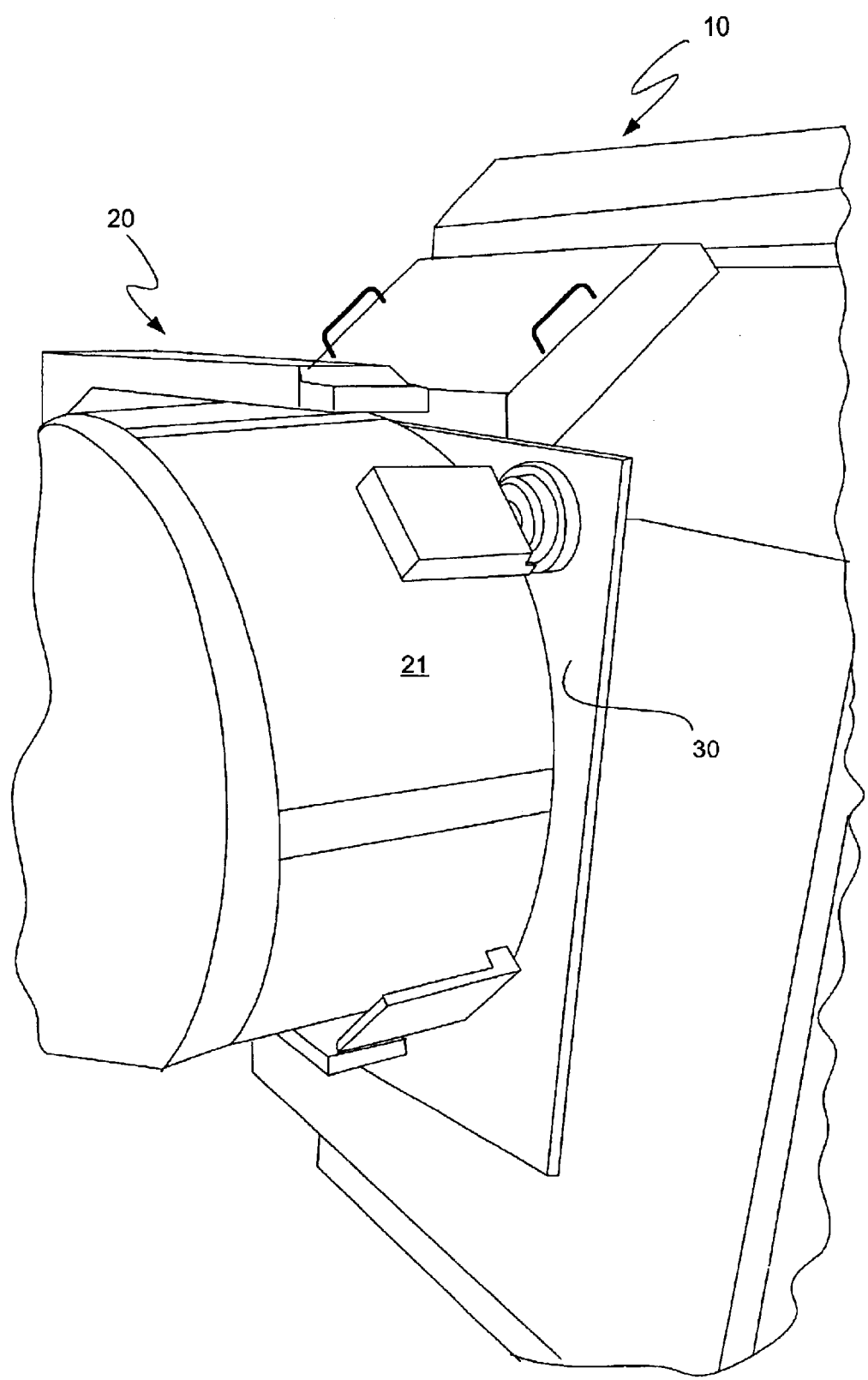
FIG. 3 illustrates in an alternative side perspective view the exemplary tester and handler of FIG. 2.
Figure 4:
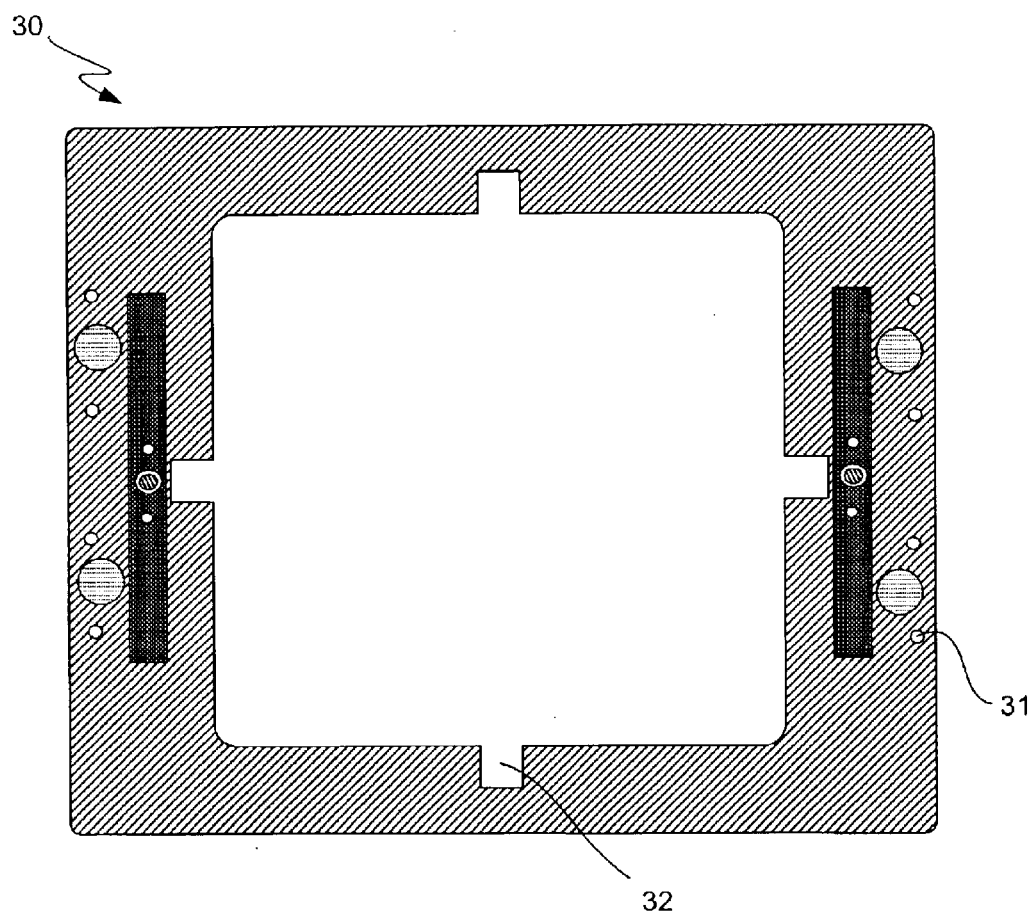
FIG. 4 illustrates in front perspective view an exemplary conventional docking plate used for docking a tester to a handler during the electrical testing of an integrated circuit during a commercial chip manufacturing process.
Figure 6:
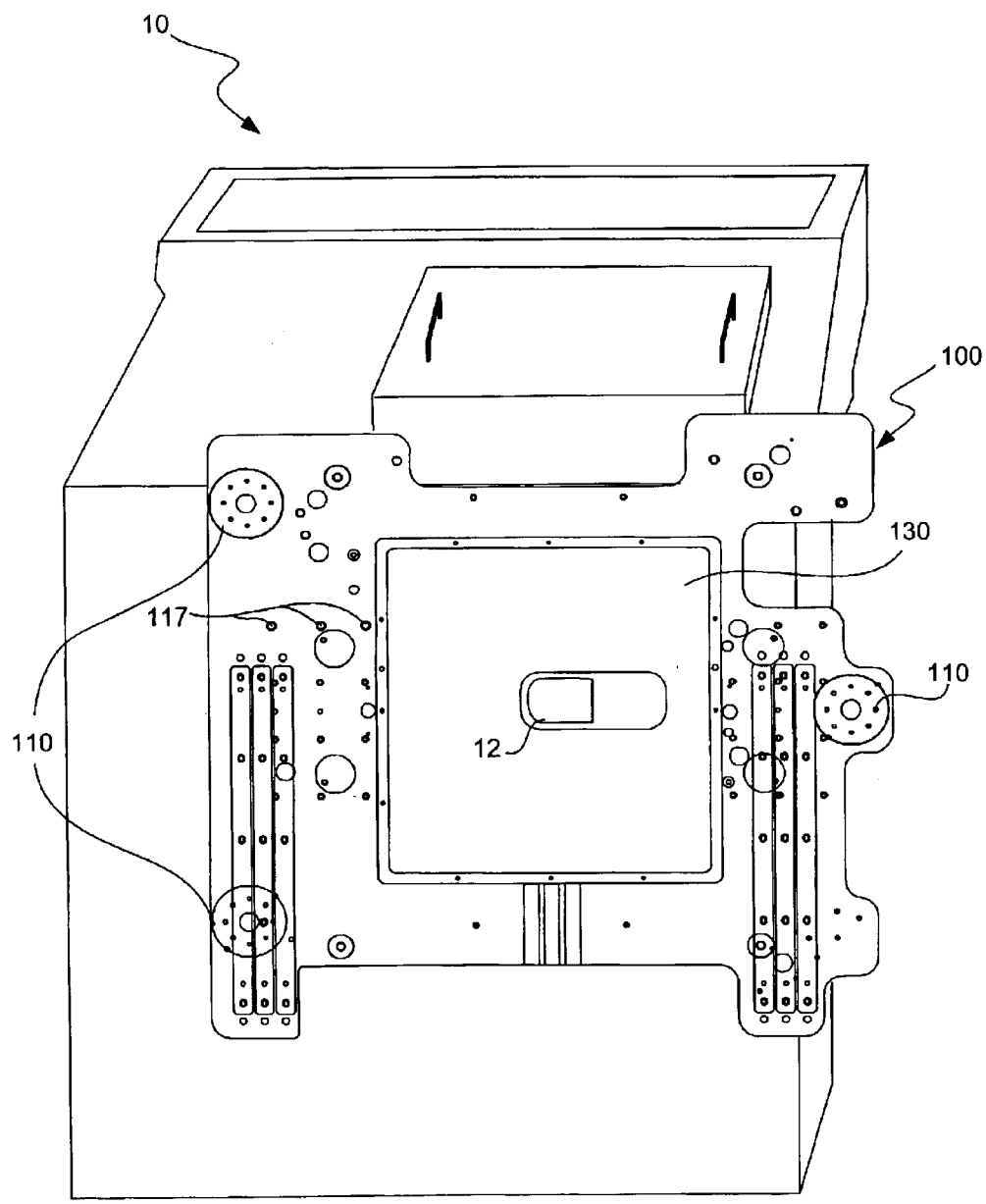
FIG. 6 illustrates in front perspective view the exemplary universal docking plate of FIG. 5 mounted to the exemplary handler of FIG. 1 according to one embodiment of the present invention.

Referring next to FIG. 6, the exemplary universal docking plate of FIG. 5 is illustrated in front perspective view as having been mounted to the exemplary handler of FIG. 1, according to a preferred embodiment of the present invention. As discussed in detail above, universal docking plate 100 comprises a plurality of mounting hole groupings 110, with each such grouping corresponding to all features that are required to mount a particular tester or handler. In the event of a Multitest 9308 handler 10, all individual mounting holes 117 corresponding to this handler type have been used to mount or affix the universal docking plate to the handler. As also discussed in detail above, universal docking plate 100 comprises a central opening 130 that is set about the test site 12 of the handler 10. As illustrated, universal docking plate 100 has been completely and firmly mounted to handler 10, and only requires the mounting of the particular adaptor component or components that correspond to whatever tester is next in line to be used with this handler.

Figure 7:
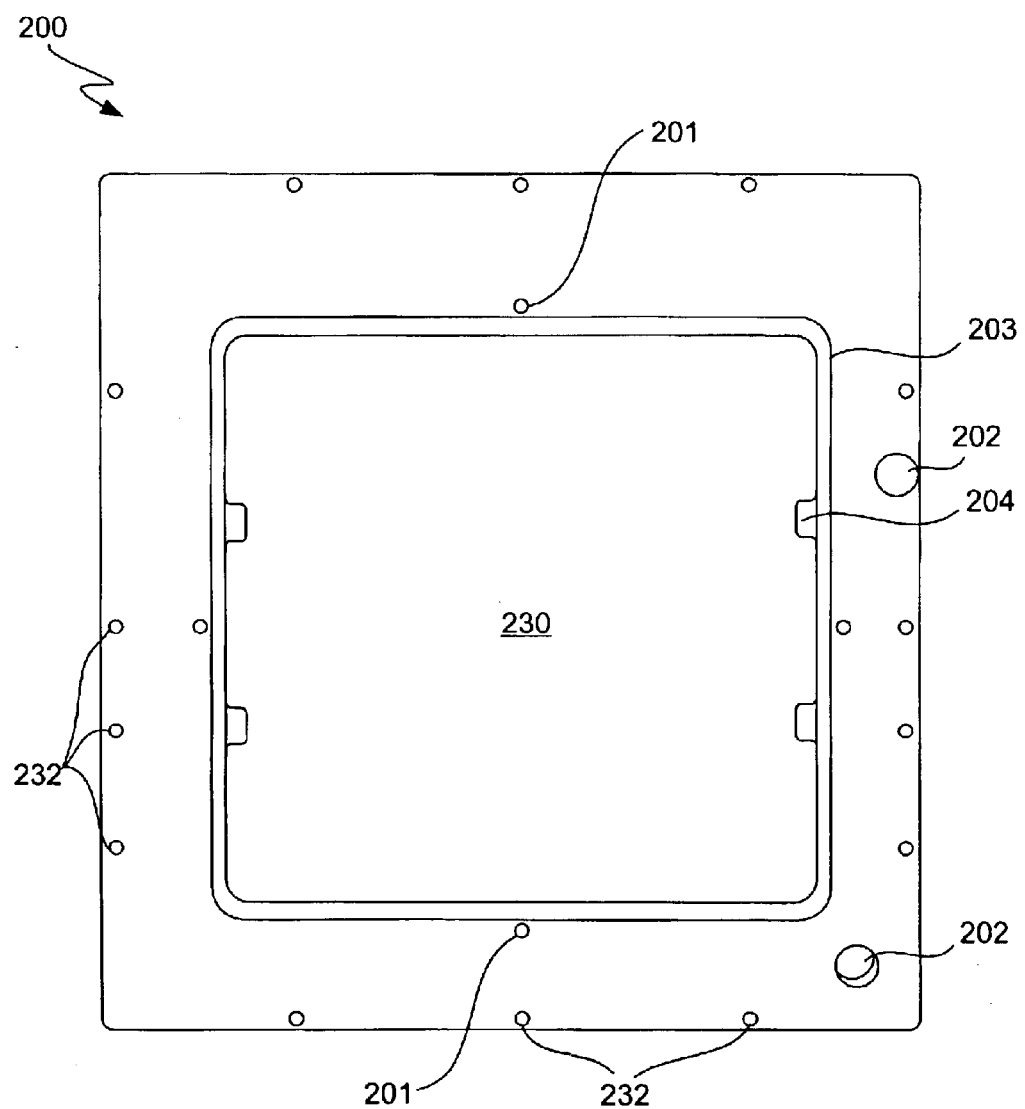
FIG. 7 illustrates in front perspective view an exemplary universal docking plate adaptor according to one embodiment of the present invention.
Figure 8:
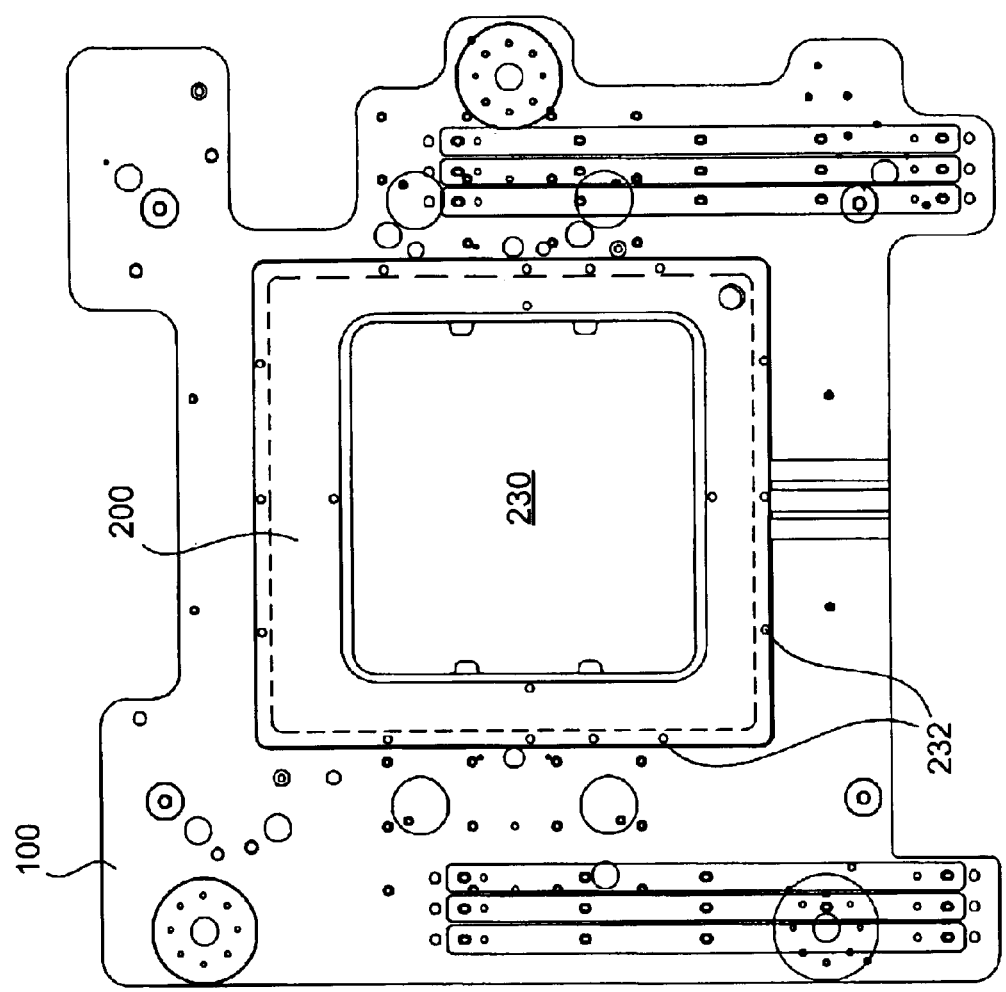
FIG. 8 illustrates in front perspective view the exemplary universal docking plate adaptor of FIG. 7 coupled with the exemplary universal docking plate of FIG. 5 according to one embodiment of the present invention.

Turning now to FIG. 7 an exemplary universal docking plate adaptor according to one embodiment of the present invention is illustrated in front perspective view. Adaptor 200 is specifically constructed to accommodate all required features for a Teradyne J750 or similar type tester that the universal docking plate does not account for itself, as well as to mate with universal docking plate 100. Adaptor 200 comprises a plurality of holes 201 and 202 that are required in the central or test site region of a docking plate by the Teradyne J750 or similar type tester. In addition, adaptor 200 also comprises a recessed shelf 203 and several tabs 204 ringing the interior opening 230, as also required by a Teradyne J750 or similar type of tester. Finally, mounting holes 232 are located along the outer perimeter of adaptor 200 in a spaced fashion that corresponds to the mating requirements for adaptor 200 and universal docking plate 100. Referring to FIG. 8 the exemplary universal docking plate adaptor of FIG. 7 is shown as having been coupled or mated with the exemplary universal docking plate of FIG. 5 according to one embodiment of the present invention in front perspective view. The specifics of both universal docking plate 100 and adaptor 200 have been provided in full detail above, and this illustration merely provides additional context for the interaction between the universal docking plate and adaptor as they are coupled together.

Figure 9:
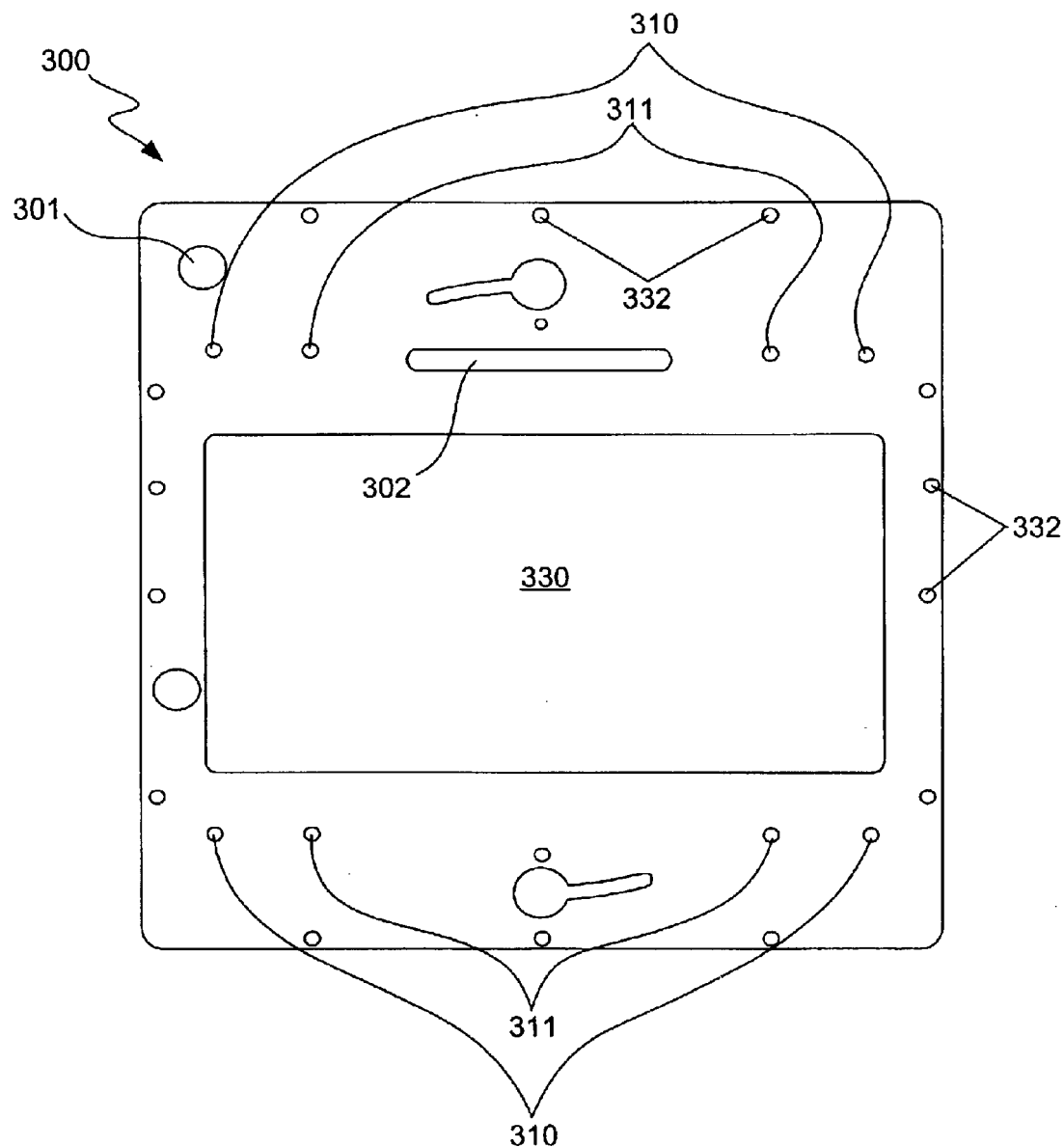
FIG. 9 illustrates in front perspective view an alternative exemplary universal docking plate adaptor according to one embodiment of the present invention.

Turning now to FIG. 9, another exemplary universal docking plate adaptor according to another embodiment of the present invention is similarly illustrated in front perspective view. Adaptor 300 is specifically constructed to accommodate the required features for a Teradyne A567, Teradyne A575, Teradyne A530, Teradyne A535 or any other similar type tester (collectively a "Teradyne A5xx") that the universal docking plate does not account for itself, as well as to mate with universal docking plate 100. Furthermore, adaptor 300 is also specifically constructed to accommodate required features for an Eagle ETS200 tester, as detailed herein.

Adaptor 300 comprises a plurality of various holes 301, slots 302, a central opening 330, and other unique features that are required in the central or test site region of a docking plate by a Teradyne A5xx or Eagle ETS200. In particular, adaptor 300 comprises mounting holes 310, which are used for the dowel pins of a Teradyne A530 or a Teradyne A535 tester. Furthermore, adaptor 300 also comprises additional mounting holes 311, which are used for the dowel pins of an Eagle ETS200 tester. As in the case of adaptor 200, adaptor 300 also comprises mounting holes 332 located along its outer perimeter in a spaced fashion that corresponds to the mating requirements for adaptor 300 and universal docking plate 100.

Figure 10:
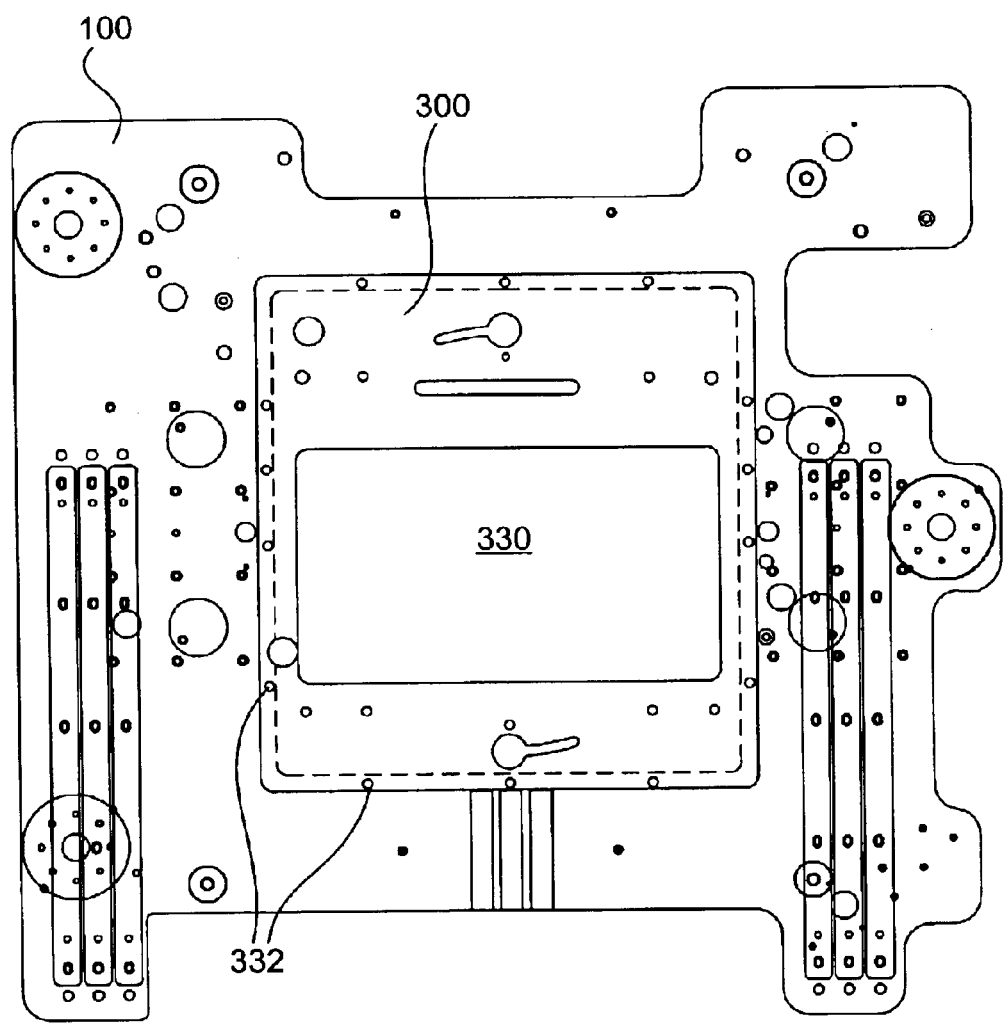
FIG. 10 illustrates in front perspective view the exemplary alternative universal docking plate adaptor of FIG. 9 coupled with the exemplary universal docking plate of FIG. 5 according to one embodiment of the present invention.

Referring to FIG. 10 the exemplary universal docking plate adaptor of FIG. 9 is shown as having been coupled or mated with the exemplary universal docking plate of FIG. 5 according to another embodiment of the present invention in front perspective view. As in the case of adaptor 200, the specifics of both universal docking plate 100 and adaptor 300 have been provided in full detail above, and this illustration merely provides additional context for the interaction between the universal docking plate and adaptor as they are coupled together.

Figure 11:
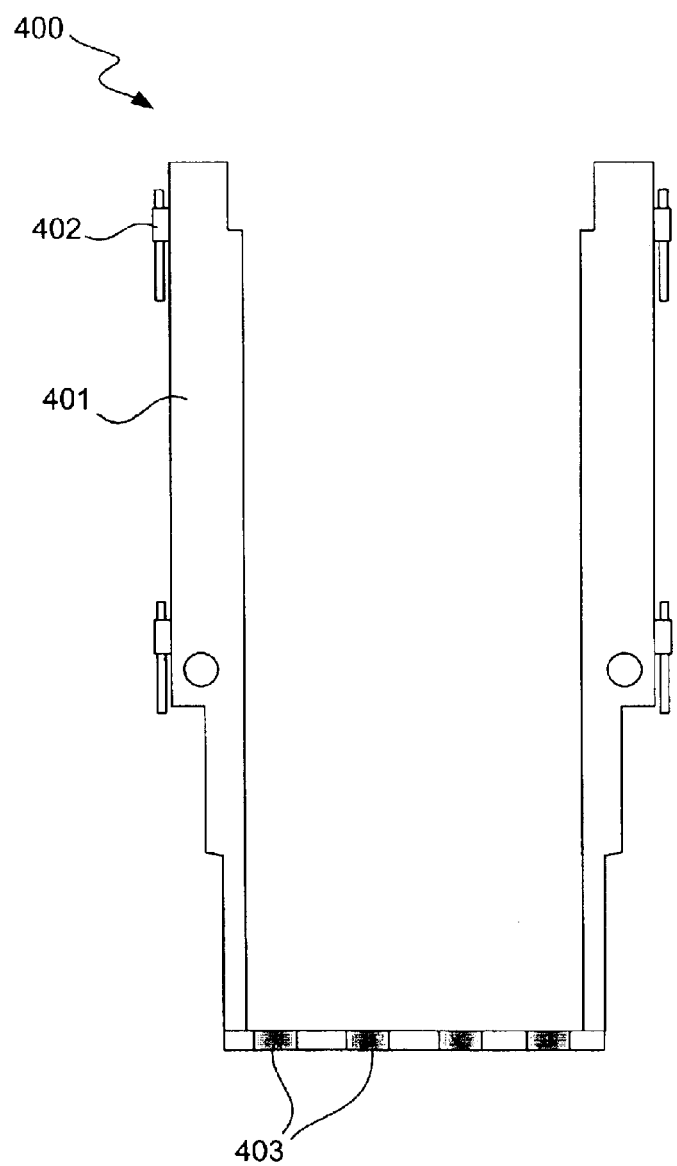
FIG. 11 illustrates in front perspective view yet another alternative exemplary universal docking plate adaptor according to one embodiment of the present invention.

Turning now to FIG. 11, yet another exemplary universal docking plate adaptor according to another preferred embodiment of the present invention is illustrated in front perspective view. Adaptor 400, which is specifically designed to work in conjunction with an adaptor similar to adaptor 200 or adaptor 300 described above, is constructed to accommodate some of the additional required features for an Eagle ETS200 or any other similar type tester, such features as will be known by one skilled in the art. Adaptor 400 generally comprises a frame structure 401, a plurality of connectors 402, a plurality of cable support openings 403, and other unique features that are required in the central or test site region of a docking plate for an Eagle ETS200 or other similar type tester.

Figure 12:
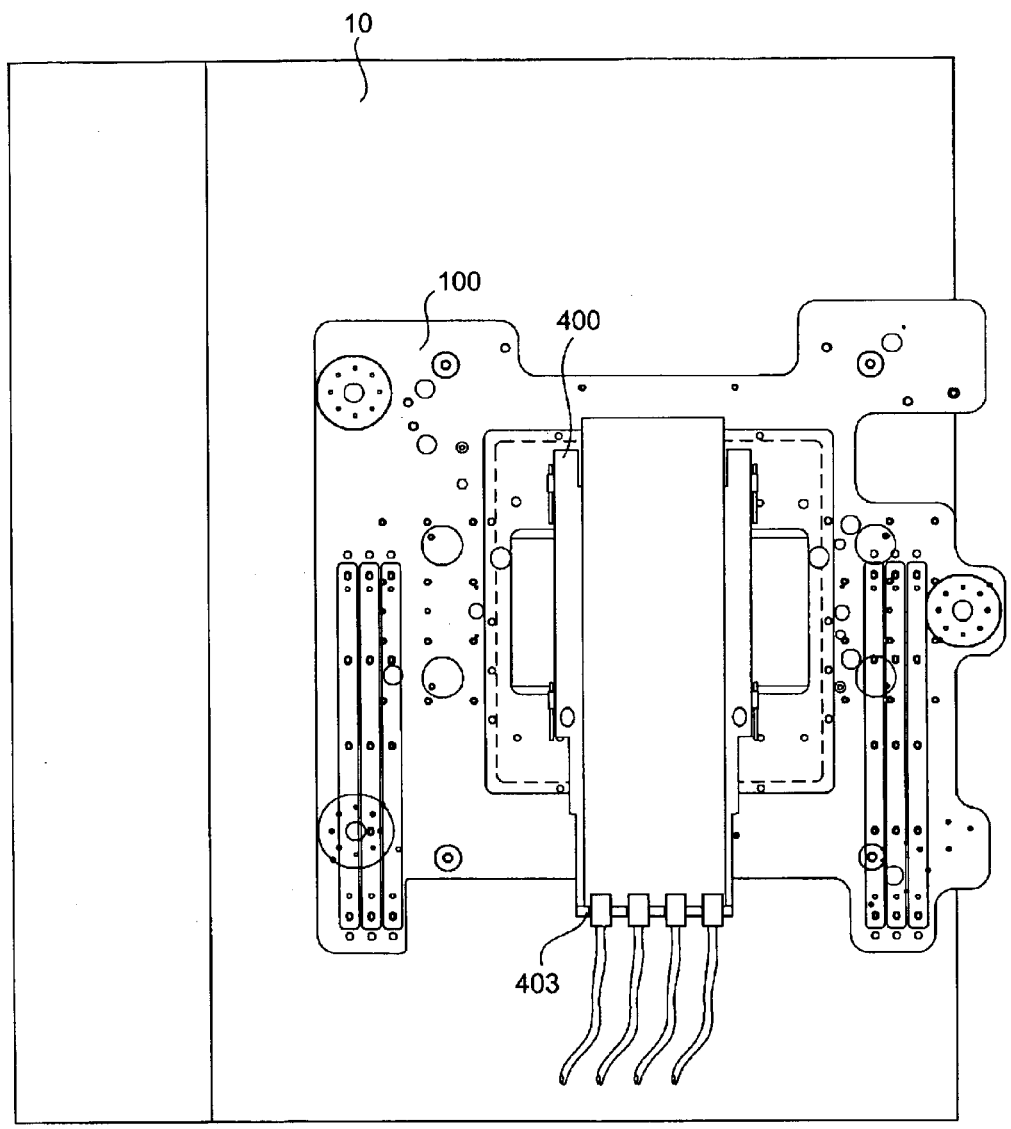
FIG. 12 illustrates in front elevation view the exemplary alternative universal docking plate adaptor of FIG. 11 coupled with the exemplary universal docking plate of FIG. 5, with both of these items mounted to the exemplary handler of FIG. 1 according to one embodiment of the present invention.

Referring to FIG. 12 the exemplary universal docking plate adaptor of FIG. 11 is shown in front perspective view as having been coupled or mated with the exemplary universal docking plate of FIG. 5, with both of these items having been mounted to the exemplary handler of FIG. 1 according to another embodiment of the present invention. As in the case of adaptors 200 and 300 above, the specifics of both universal docking plate 100 and adaptor 400 have been provided in full detail above, and this illustration merely provides additional context for the interaction between the universal docking plate and adaptor as they are coupled together.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. An apparatus, comprising:
 a docking plate configured to couple one or more types of integrated circuit electrical testing testers to one or more types of integrated circuit electrical testing handlers, wherein the sum of all possible types of testers and all possible types of handlers that can be coupled by said docking plate is at least three.

2. The apparatus of claim 1, wherein said docking plate comprises a plurality of mounting holes, said plurality of mounting holes corresponding to a plurality of different types of handlers, a plurality of different types of testers, or both.

3. The apparatus of claim 2, wherein at least a portion of said plurality of mounting holes corresponds to a plurality of different types of testers.

4. The apparatus of claim 3, wherein at least a portion of said plurality of mounting holes corresponds to at least seven different types of testers.

5. The apparatus of claim 2, wherein at least a portion of said plurality of mounting holes corresponds to a plurality of different types of handlers.

6. The apparatus of claim 2, wherein at least a portion of said plurality of mounting holes belongs to a plurality of particular groupings of mounting holes.

7. The apparatus of claim 6, wherein each particular grouping of mounting holes corresponds to a different type of tester or handler.

8. The apparatus of claim 1, wherein the sum of all possible types of testers and all possible types of handlers that can be coupled by said docking plate is at least four.

9. The apparatus of claim 1, wherein the sum of all possible types of testers and all possible types of handlers that can be coupled by said docking plate is at least eleven.

10. The apparatus of claim 1, further comprising:
one or more adaptors configured to couple said docking plate to said one or more types of integrated circuit electrical testing testers.

11. The apparatus of claim 10, wherein each of said one or more adaptors corresponds to a different type of tester.

12. A method of testing an integrated circuit, comprising:
selecting a first integrated circuit electrical testing tester adapted to test said integrated circuit;
selecting a first integrated circuit electrical testing handler adapted to locate said integrated circuit into a position to be tested; and
coupling said first integrated circuit electrical testing handler to said first integrated circuit electrical testing tester with a docking plate, wherein said docking plate is configured to couple one or more types of integrated circuit electrical testing testers to one or more types of integrated circuit electrical testing handlers, wherein the sum of all possible types of testers and all possible types of handlers that can be coupled by said docking plate is at least three.

13. The method of claim 12, wherein the sum of all possible types of testers and all possible types of handlers that can be coupled by said docking plate is at least four.

14. The method of claim 12, wherein the sum of all possible types of testers and all possible types of handlers that can be coupled by said docking plate is at least eleven.

15. The method of claim 12, wherein said docking plate comprises a plurality of mounting holes, said plurality of mounting holes corresponding to a plurality of different types of handlers, a plurality of different types of testers, or both.

16. The method of claim 15, wherein at least a portion of said plurality of mounting holes corresponds to a plurality of different types of testers.

17. The method of claim 15, wherein at least a portion of said plurality of mounting holes belongs to a plurality of particular groupings of mounting holes.

18. The method of claim 12, further including the step of:
selecting a first adapter, said first adapter configured to couple said docking plate to said first integrated circuit electrical testing tester.

19. The method of claim 12, further including the steps of:
selecting a second integrated circuit electrical testing tester adapted to test said integrated circuit; and
coupling said first integrated circuit electrical testing handler to said second integrated circuit electrical testing tester with said docking plate.

20. An apparatus, comprising:
a coupling means for coupling one or more types of integrated circuit electrical testing testers to one or more types of integrated circuit electrical testing handlers, wherein the sum of all possible types of testers and all possible types of handlers that can be coupled by said coupling means is at least three.

21. A docking plate configured to couple at least one integrated circuit electrical testing tester to at least one integrated circuit electrical testing handler, said docking plate comprising:
a first set of one or more coupling features adapted to facilitate the coupling of a first type of integrated circuit electrical testing handler to a first type of integrated circuit electrical testing tester, wherein said handler comprises a robot adapted to move integrated circuit devices from one location to a test location, and wherein said tester comprises a piece of computing equipment that transmits test signals via tester probes to an integrated circuit device and also processes signals received from the integrated circuit device; and
a second set of one or more coupling features adapted to facilitate the coupling of either a second type of integrated circuit electrical testing tester to said first type of integrated circuit electrical testing handler or said first type of integrated circuit electrical testing tester to a second type of integrated circuit electrical testing handler, wherein at least a portion of said second set of one or more coupling features is distinct from said first set of one or more coupling features.

22. The docking plate of claim 21, wherein said first set of one or more coupling features comprises one or more items selected from the group consisting of shapes, contours, holes, grooves and indentations.

23. The docking plate of claim 21, wherein the sum of all possible types of testers and all possible types of handlers that can be coupled by said docking plate is at least three.

24. The docking plate of claim 23, wherein the sum of all possible types of testers and all possible types of handlers that can be coupled by said docking plate is at least eleven.

25. The docking plate of claim 21, wherein:
said first type of integrated circuit electrical testing tester is selected from the group consisting of a Teradyne J750, a Teradyne Catalyst, a Teradyne A567 or Teradyne A575, a Teradyne A530 or Teradyne A535, an Eagle E500, an Eagle E364, and an Eagle E200;
said first type of integrated circuit electrical testing handler is selected from the group consisting of a Multitest MT9918 or Multitest MT9308, a Yogokawa 9730, a Delta 1688 or Delta Turbo, and a Synax SX1701; or both.

* * * * *